US009142606B2

(12) United States Patent
Okabe (10) Patent No.: US 9,142,606 B2
(45) Date of Patent: Sep. 22, 2015

(54) SEMICONDUCTOR DEVICE HAVING AN INDUCTOR MOUNTED ON A BACK FACE OF A LEAD FRAME

(71) Applicant: Sanken Electric Co., LTD., Niiza-shi, Saitama (JP)

(72) Inventor: Yasuhiro Okabe, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/248,440

(22) Filed: Apr. 9, 2014

(65) Prior Publication Data
US 2014/0299977 A1 Oct. 9, 2014

(30) Foreign Application Priority Data

Apr. 9, 2013 (JP) ................. 2013-080985

(51) Int. Cl.
H01L 23/495 (2006.01)
H01L 49/02 (2006.01)
H01F 17/00 (2006.01)
H01L 23/31 (2006.01)
H01L 23/00 (2006.01)
H01L 23/40 (2006.01)

(52) U.S. Cl.
CPC ............ *H01L 28/10* (2013.01); *H01F 17/0006* (2013.01); *H01L 23/495* (2013.01); *H01L 23/49541* (2013.01); *H01L 23/49562* (2013.01); *H01L 23/49575* (2013.01); *H01L 23/49589* (2013.01); *H01L 23/3107* (2013.01); *H01L 23/4006* (2013.01); *H01L 24/48* (2013.01); *H01L 24/49* (2013.01); *H01L 2224/48195* (2013.01); *H01L 2224/48247* (2013.01); *H01L 2224/49111* (2013.01); *H01L 2224/49177* (2013.01); *H01L 2924/1815* (2013.01); *H01L 2924/19041* (2013.01); *H01L 2924/19042* (2013.01); *H01L 2924/19105* (2013.01); *H01L 2924/19106* (2013.01); *H01L 2924/19107* (2013.01)

(58) Field of Classification Search
CPC ... H01L 23/495; H01L 23/3107; H01L 24/48; H01L 24/49; H01L 2224/48195; H01L 2224/48247; H01L 23/49861; H01L 23/4951
USPC ........................................................ 257/666
See application file for complete search history.

(56) References Cited

U.S. PATENT DOCUMENTS

2008/0020488 A1* 1/2008 Clevenger et al. ................. 438/3
2009/0134964 A1* 5/2009 Hebert et al. ................. 336/200
2009/0315162 A1* 12/2009 Liu et al. ....................... 257/676

FOREIGN PATENT DOCUMENTS

JP 2007-318954 * 12/2007
JP 2007-318954 A 12/2007

* cited by examiner

*Primary Examiner* — Khiem D Nguyen
(74) *Attorney, Agent, or Firm* — Banner & Witcoff, Ltd.

(57) ABSTRACT

A semiconductor device includes: a lead frame; an IC element mounted on a main face of the lead frame; an inductor mounted on a back face of the lead frame; and a resin body configured to seal the lead frame, the IC element and the inductor, wherein the inductor and the lead frame are closely contacted with each other, wherein the IC element is disposed at a position corresponding to an center axis of the inductor, wherein the inductor and the IC element are electrically connected to each other, and wherein wiring of main current flowing through the IC element is disposed between terminals of the inductor.

9 Claims, 6 Drawing Sheets

SEMICONDUCTOR DEVICE HAVING AN INDUCTOR MOUNTED ON A BACK FACE OF A LEAD FRAME

CROSS-REFERENCE TO RELATED APPLICATION

This application claims priority from Japanese Patent Application No. 2013-080985 filed on Apr. 9, 2013, the entire subject matter of which is incorporated herein by reference.

TECHNICAL FIELD

This disclosure relates to a semiconductor device including an inductor.

BACKGROUND

There is a semiconductor device including a DC-DC converter as a power converter for converting a power source voltage to a predetermined operating voltage. In such a semiconductor device, a SON-type (Small Outline Non-leaded type) semiconductor device with a small size and a low profile has been generally known in which an inductor (coil), IC chip and capacitor are mounted on a main face of a frame. (See JP-A-2007-318954)

SUMMARY

On the other hand, in such a background semiconductor device, an inductor and IC chip (hereinafter, simply referred to as "IC") are laminated while having substantially the same size and therefore the inductor is mounted in a space apart from the frame. Accordingly, since there is a distance between the inductor that generates the electromagnetic field and the frame, leakage flux is increased, and there is a possibility that the radiation noise is increased.

This disclosure provides at least a semiconductor device that is capable of suppressing an increase in the radiation noise by the electromagnetic field generated in the inductor.

A semiconductor device of this disclosure includes: a lead frame; an IC element mounted on a main face of the lead frame; an inductor mounted on a back face of the lead frame; and a resin body configured to seal the lead frame, the IC element and the inductor, wherein the inductor and the lead frame are closely contacted with each other, wherein the IC element is disposed at a position corresponding to an center axis of the inductor, wherein the inductor and the IC element are electrically connected to each other, and wherein wiring of main current flowing through the IC element is disposed between terminals of the inductor.

According to this disclosure, it is possible to provide a semiconductor device in which there is no distance between an inductor and a frame and thus the increase in the radiation noise generated in the inductor is suppressed.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Figure 1A:
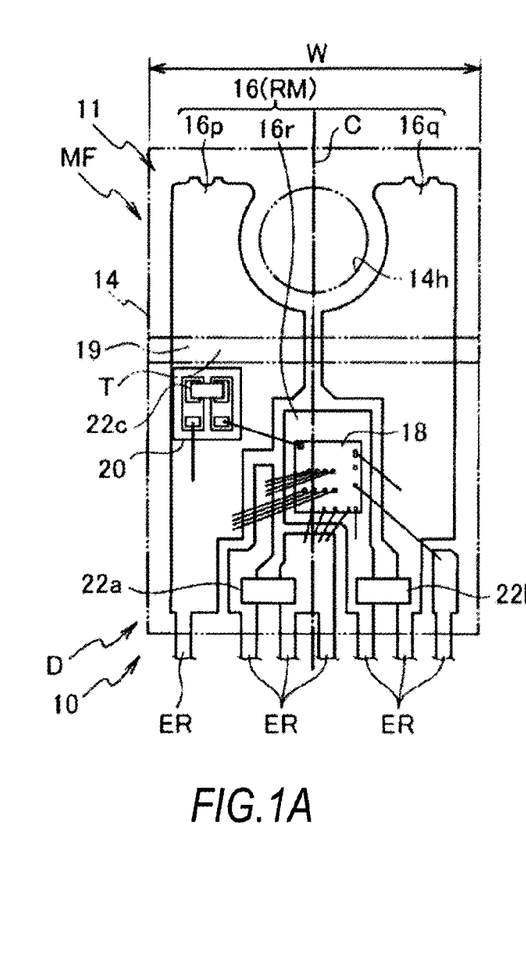
FIGS. 1A to 1C are, respectively, a front view, a side view and a rear view illustrating an internal configuration of a semiconductor device according to an illustrative embodiment of this disclosure.
Figure 1B:
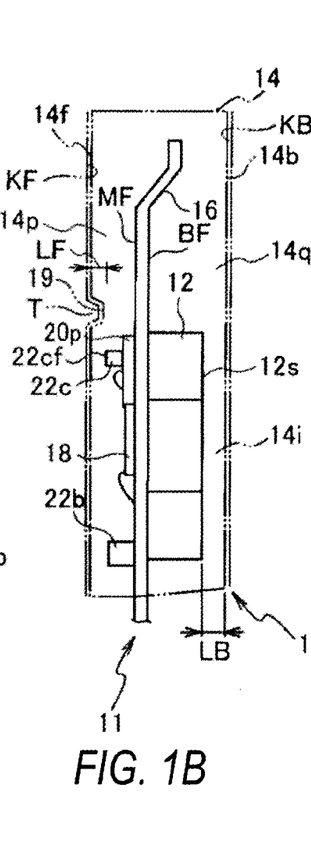
Figure 1C:
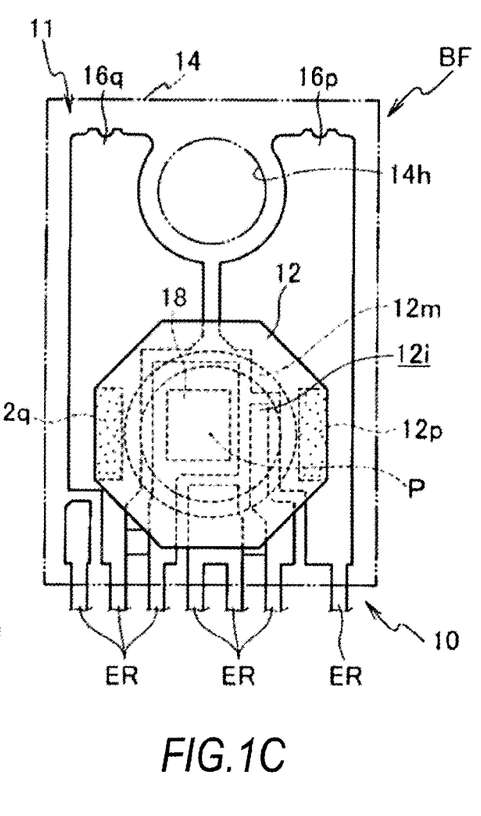
Figure 2A:
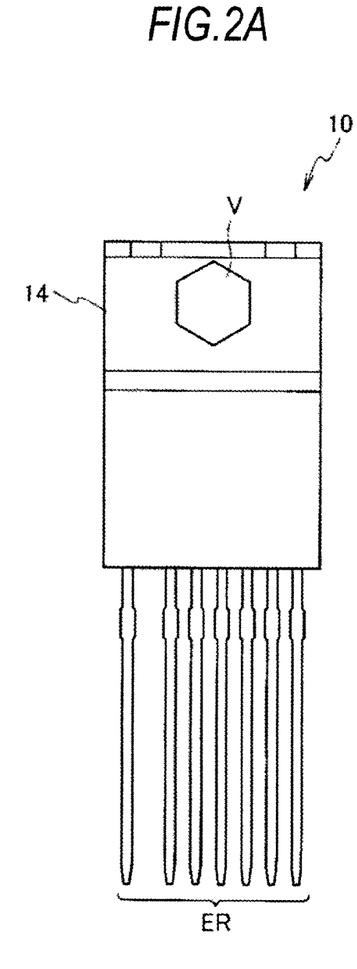
FIGS. 2A and 2B are, respectively, a front view and a side view of the semiconductor device illustrating an external configuration of the present embodiment of this disclosure.
Figure 2B:
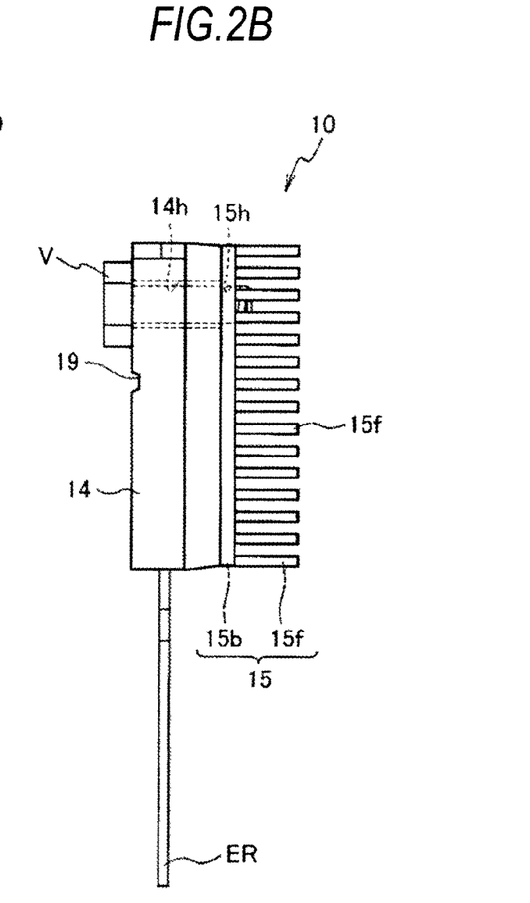

Hereinafter, an illustrative embodiment of this disclosure will be described with reference to the accompanying drawings. FIGS. 1A to 1C respectively illustrate a front view, a side view and a rear view for explaining an internal configuration of a semiconductor device according to an illustrative embodiment (hereinafter, referred to as "present embodiment") of this disclosure. FIGS. 2A and 2B respectively illustrate a front view and a side view for explaining an external configuration of the semiconductor device according to the present embodiment of this disclosure.

A semiconductor device 10 according to the present embodiment is a SIP-type (Single In-line Package) resin-sealed semiconductor device and an inductor built-in module (inductor built-in regulator).

The semiconductor device 10 includes a lead frame RM, a circuit element D mounted on a main face MF (front face) of the lead frame RM as an electrical element, an inductor (coil) 12 that is mounted on a back face BF of the lead frame RM, a resin body 14 that seals the circuit element D and the inductor 12 by resin. A heat sink 15 may be screw-fixed to an external wall of the resin body 14 in the back face BF to radiate the heat generated inside the device to the outside of the device.

The lead frame RM is made of metal such as copper or copper alloy. In the present embodiment, the lead frame RM is mainly configured by three split frames 16p to 16r which are divided and are not integrated to each other. In other words, the split frames are electrically insulated from each other.

As shown in FIG. 1A, the split frames 16p and 16q are disposed at left and right positions and the split frame 16r is disposed at a center position, when viewing the semiconductor device 10 from the front side.

Further, in the present embodiment, an MIC (monolithic integrated circuit) 18, a substrate (organic substrate) 20p and chip capacitors 22a to 22c are mounted as the circuit element D. In the present embodiment, the electrical conductivity of the lead frame RM is greater than the electrical conductivity of the MIC 18.

The MIC 18 is mounted on the split frame 16r. The chip capacitor 22a is mounted across the split frames 16p and 16r, and the chip capacitor 22b is mounted across the split frames 16q and 16r.

The substrate 20p is disposed on the split frame 16p. Further, the chip capacitor 22c is mounted on the substrate 20p.

In the present embodiment, the inductor 12 is a pot core made of ferromagnetic material. Further, the MIC 18 is disposed at a position corresponding to an axis (center axis) P of the inductor 12. The position corresponding to the axis P of the inductor 12 refers to a position which is close to the axis P of the inductor 12 and hardly influenced by the electromagnetic field generated in the inductor 12. In the present embodiment, the corresponding position is set to a position on an inner peripheral side 12i of a main body 12m (coiled current passing part) of the inductor 12, as seen from the direction of the center axis of the inductor 12.

The substrate 20p is disposed on the split frame 16p. Further, the chip capacitor 22c is mounted on the substrate 20p.

As shown in FIGS. 1B and 1C, electrical connection surfaces 12p, 12q are formed on both sides of the mounting face of the inductor 12. The inductor 12 is mounted on the back surface BF of the lead frame RM so that the electrical connection surfaces 12p, 12q are in surface-contact with the split frames 16p, 16q, respectively. In addition, the MIC 18 on the main face MF and the inductor 12 on the back face BF are arranged so as to sandwich the lead frame RM therebetween. Although the inductor 12 has a polygonal columnar shape (e.g., an octagonal columnar shape, as shown in FIG. 1C) in the present embodiment, the inductor 12 may have a circular columnar shape.

Upon placing the circuit element D or the substrate 20 on the split frame 16, the substrate 20 is fixed to the split frame 16 in such a way that the substrate 20 is adhered by adhesive, and the circuit element D or the inductor 12 are closely-fixed to the split frame 16 by applying and thermally curing silver paste or performing a soldering such as a reflow at the time of mounting.

Further, the semiconductor device 10 includes a plurality of outer leads ER extending out from the resin body 14. The resin body 14 is formed by mold resin, etc., so as to seal the MIC 18, the substrate 20, the chip capacitors 22a to 22c and the portion of the split frame 16 other than the outer leads, by resin. A through hole 14H is formed in an upper portion (the portion opposite to a side at which the outer lead ER extends out) of the resin body 14 of the semiconductor device. A screw can be inserted through the through hole 14H. The portion of the split frames 16p and 16q that is located at an upper side of the semiconductor device is in an arrangement and shape such that the portion is not exposed to the through hole 14H.

Further, the heat sink 15 is formed with a screw engagement hole 15H (female screw, see FIG. 2B). The heat sink 15 includes a plate-like radiation substrate 15b that comes into contact with an outer wall of the resin body 14 and a plurality of radiation fins 15f that is arranged to erect on the radiation substrate 15b. The heat sink 15 is manufactured in advance before manufacturing the semiconductor device 10. The material of the heat sink 15 is copper or aluminum, for example.

Here, in a resin body portion 14p of the resin body 14 forming the main face of the lead frame RM, the shortest distance (thickness of the resin body) from the electronic components to a resin body face 14f is a distance (thickness) LF (e.g., 0.4 mm) from the chip capacitor 22c disposed on the substrate 20p to the resin body face 14f. Further, a distance LB (e.g., 0.75 mm) from a face 12s of the inductor 12 to a resin body back face 14B is set to be larger than the distance (thickness) LF. In addition, the distance LB is equal to or less than a predetermined distance (a predetermined thickness). Here, the predetermined distance refers to a distance (thickness) that does not interfere with the purpose of transmitting and radiating the heat generated in the inductor 12 to a resin body portion 14q forming the back face of the lead frame RM. The predetermined distance is determined by the heat generation amount, the thickness or the like of the inductor 12.

Figure 3:
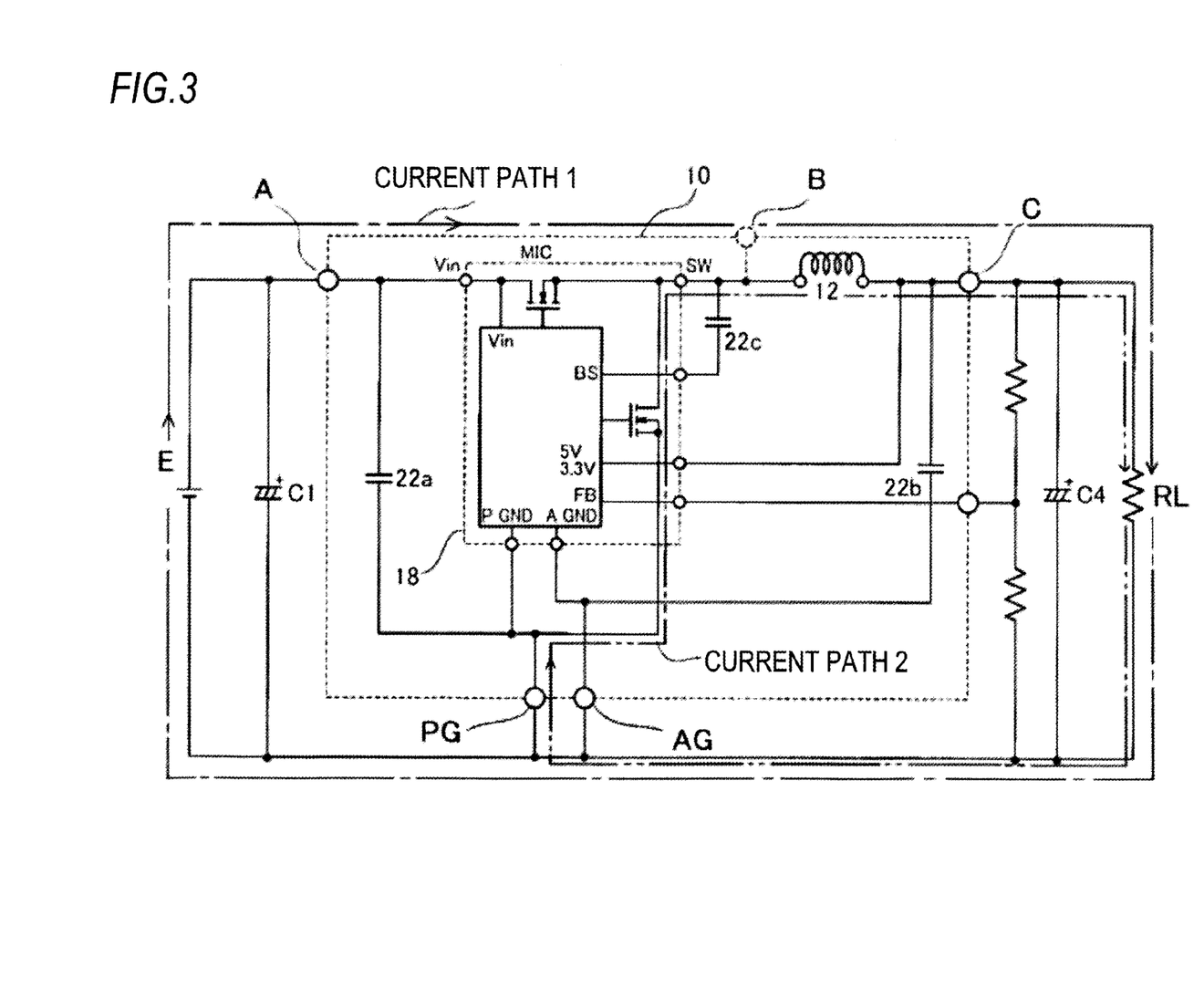
FIG. 3 is a circuit diagram of one exemplary embodiment of the semiconductor device according to the present embodiment, illustrating an example where a switching element is provided in MIC.
Figure 4:
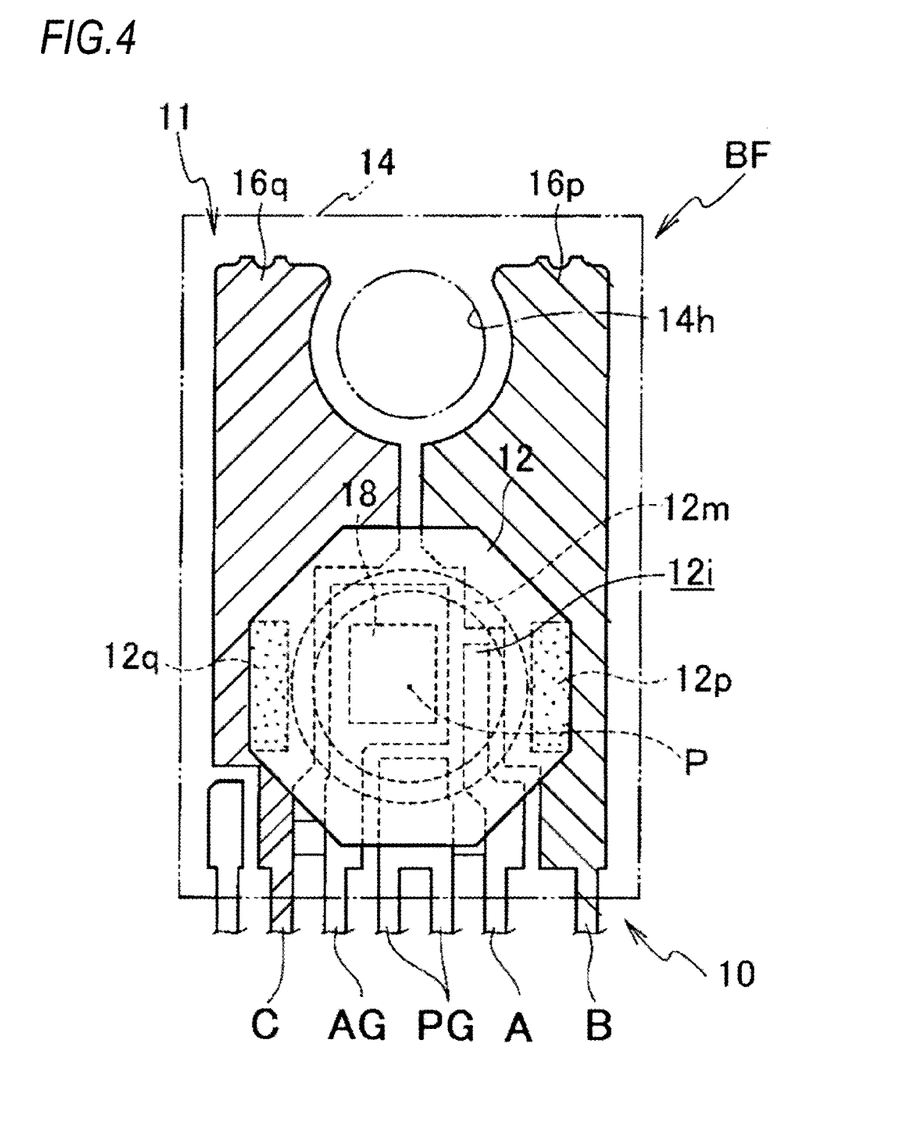
FIG. 4 is a view illustrating the arrangement of the internal wiring of the semiconductor device according to the present embodiment.

FIG. 3 is a circuit diagram of one exemplary embodiment of the semiconductor device according to the present embodiment, illustrating an example where a switching element is provided in the MIC 18. Further, FIG. 4 is a view illustrating the arrangement of the internal wiring of the semiconductor device according to the present embodiment. Further, FIG. 5 is a view illustrating the path of current flowing in the semiconductor device according to the present embodiment.

Figure 5:
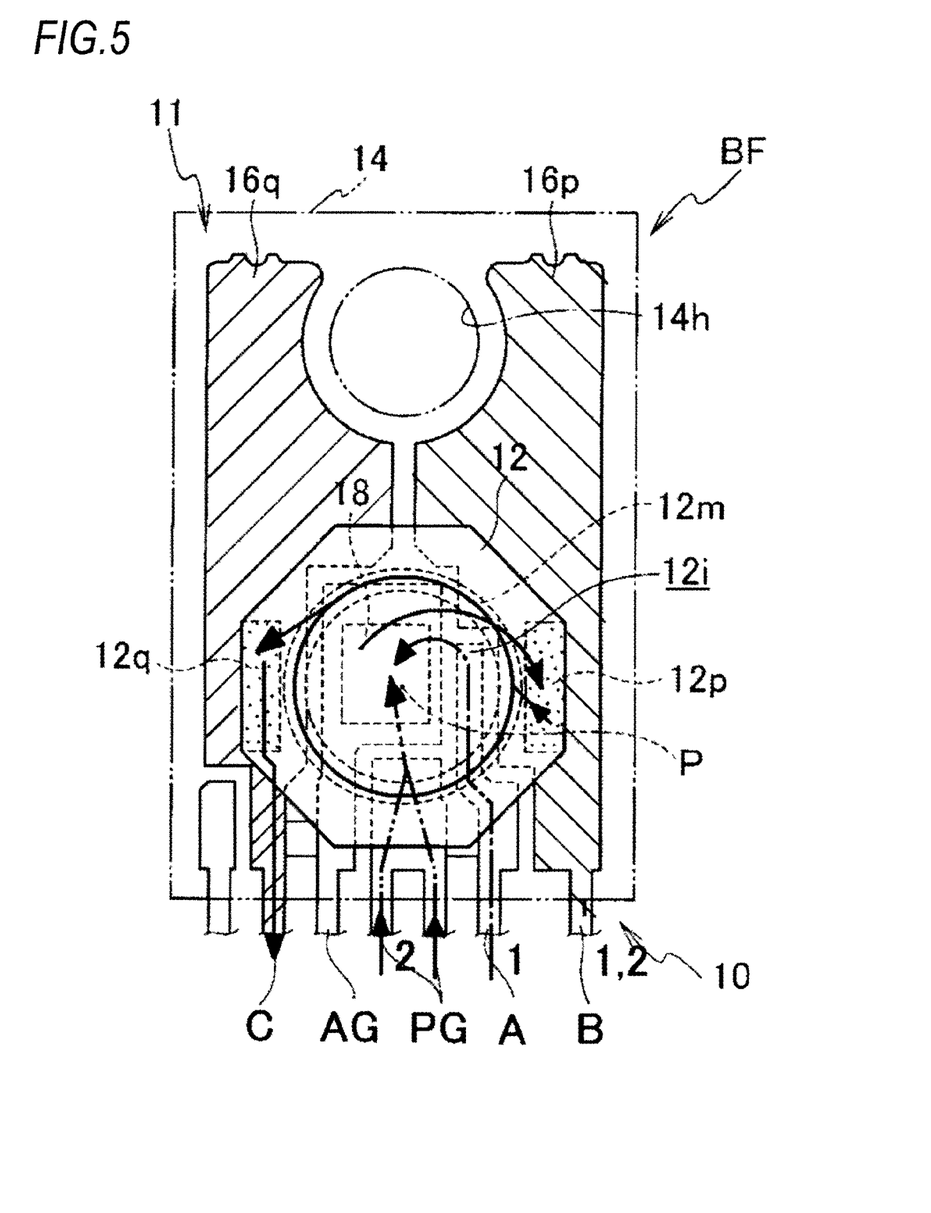
FIG. 5 is a view illustrating the path of current flowing in the semiconductor device according to the present embodiment.

Here, terminals A, B, C, AG and PG of the circuit diagram shown in FIG. 3 represent the same reference numerals as the wiring terminals shown in FIG. 4 and FIG. 5. The terminal A is an input terminal, the terminals B and C are terminals of the inductor 12 and the terminal C also serves as an output terminal. Further, the terminals AG and PG are ground terminals.

The terminals B and C of the inductor 12 shown in FIG. 4 are positioned at both sides of the lead frame RM and the wiring terminals A, AG and PG of the MIC 18 are arranged on the inside of the terminals B and C of the inductor 12.

When the switching element of the MIC 18 (shown in FIG. 3) provided between the terminals A and B is turned on, current flows from a power source E through the inductor 12 to the capacitor C4 and a load RL, in a current path 1. When the switching element of the MIC 18 provided between the terminals A and B is turned off and the switching element of the MIC provided between the terminals B and PG is turned on in a complementary manner, current flows in the current path 2. Here, a loop of the current path 1 and the current path 2 is the shortest. In FIG. 5, the current path 1 is shown as a dashed line, the current path 2 is shown as a two-dot chain line, and a joined path of the current path 1 and the current path 2 is shown as a solid line. As is apparent from the current path shown in FIG. 5, the path of current flowing in the semiconductor device can be extremely short and also the area of the path can be narrowed.

Figure 6A:
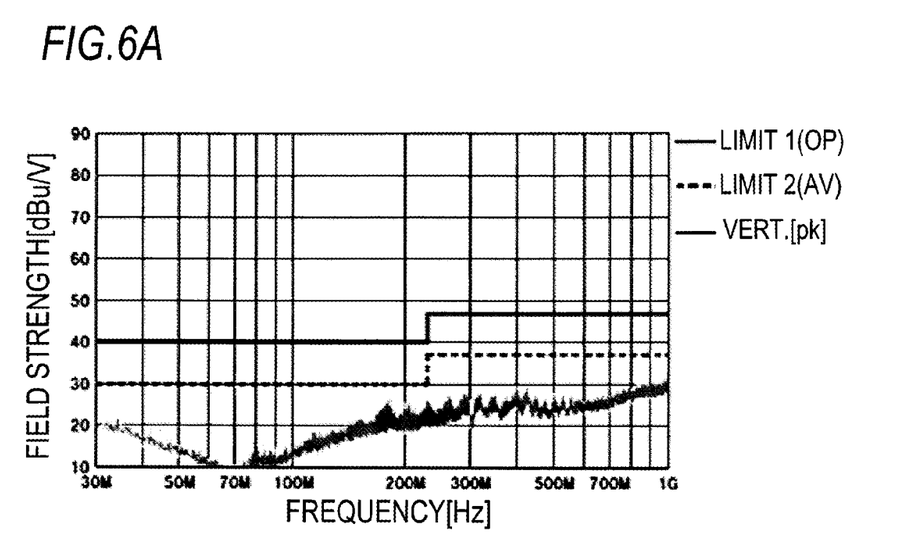
FIGS. 6A and 6B illustrates the measurement data for comparing the radiation noise data of the semiconductor device according to the present embodiment and a semiconductor device according to the background art.
Figure 6B:
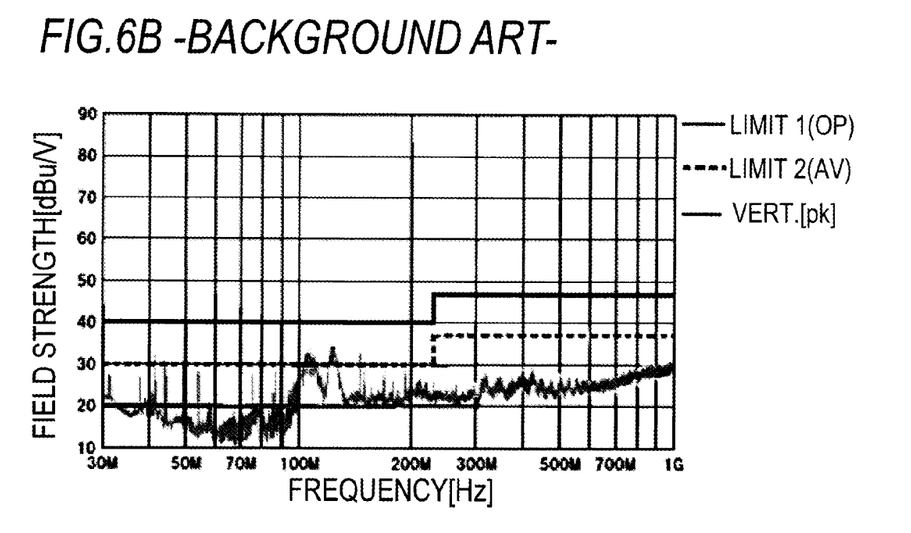

FIGS. 6A and 6B illustrate the measurement data for comparing the radiation noise data of the semiconductor device according to the present embodiment and a semiconductor device according to the background art. FIG. 6A illustrates the data of the semiconductor device according to the present embodiment, and FIG. 6B illustrates the data of the semiconductor device according to the background art. It can be seen that, in a frequency of 30 to 200 MHz, a peak value of the radiation noise of the semiconductor device according to the present embodiment is suppressed more than 10 dB.

The effect is obtained due to the configuration where there is no distance between the frame and the inductor of the semiconductor device, according to the present embodiment and where the path of current flowing in the semiconductor device is extremely short and also the area of the path is narrowed.

Further, in the present embodiment, the MIC 18 is positioned on the inner peripheral side 12i of the main body 12m of the inductor 12, as seen from the direction of the center axis of the inductor 12. Accordingly, the MIC 18 can be hardly influenced by the electromagnetic field generated in the inductor 12 even when the inductor 12 is a pot core made of ferromagnetic material.

Further, the electrical conductivity of the lead frame RM is greater than that of the MIC 18. With this configuration, it is possible to further suppress, on the MIC 18, the influence of the electromagnetic field generated in the inductor 12.

Further, the circuit element D is mounted on the main face MF of the split frames 16p to 16r forming the lead frame RM and the inductor 12 is closely mounted on the back face BF that is opposite to the main face MF of the split frames 16p to 16r. In other words, the inductor 12 surface-contacts the back face BF so that there is no space between the inductor 12 and the back face BF. Therefore, it is possible to reduce leakage flux and the radiation noise. Further, the mountable space is effectively used. Accordingly, it is possible to significantly reduce the area of the lead frame RM (split frames 16p to 16r), as compared to a case where the circuit element D and the inductor 12 are mounted only on the main face MF. Therefore, the semiconductor device 10 can have a significantly reduced planar dimension while suppressing the thickness dimension (height dimension). In addition, the path of current flowing in the semiconductor device can be extremely short and also the area of the path can be narrowed.

Further, an outer shape of the inductor 12 is a hexagonal or more polygonal columnar shape (e.g., an octagonal columnar shape in FIG. 1C). With this chamfered shape, the resin injected into the mold is easy to flow around the inductor 12. Similarly, the resin is easy to flow around the inductor 12 even when an outer shape of the inductor 12 is a circular columnar shape.

Further, the semiconductor device 10 has a strong structure that is resistant to mechanical stress such as screw fastening by mounting the MIC 18 on the main face MF and mounting the inductor 12 on the back face BF.

Further, the lead frame RM is configured by a plurality of (three) split frames 16 that are divided from each other. Accordingly, the split frames are insulated from each other and therefore the circuit element D (MIC 18, substrate 20p and chip capacitors 22a, 22b) and the inductor 12 can be directly mounted on the split frames 16. In this way, the power supply amount of the inductor 12 can be increased, as compared to the background art. As a result, it is possible to use the inductor 12 having capacity greater than the background art. Further, since the heat generated from the circuit element D or the inductor 12 can be directly transmitted to the metallic split frames 16, the semiconductor device 10 can have an excellent heat radiation property.

Furthermore, as is apparent from FIG. 2A, the shapes of the split frames 16p to 16r in the present embodiment are substantially line symmetry with respect to a center line C. In this way, the semiconductor device 10 can be configured to easily suppress the occurrence of internal strain due to thermal stress.

Further, a heat sink 15 having radiating fins 15f is provided in an outer wall of the resin body 14 and on the back face Bf of the lead frame RM. From the front face (upper face) of the inductor 12, heat is radiated from the heat sink 15 via the resin body between the heat sink 15 and the inductor 12. From the back face (lower face) of the inductor 12, heat is radiated to the outside from an external lead (lead terminal) ER of the lead frame RM. In this manner, heat can be efficiently radiated from both sides of the inductor 12. As a result, the heat-radiation characteristic of the semiconductor device 10 to outside is further improved, and therefore it is possible to operate the semiconductor device 10 with higher power.

Further, although the MIC 18 has been described as an example of the IC element in the present embodiment, the same effects can be achieved even when another IC element is used.

Further, as shown in FIG. 4, the switching element may be incorporated in the MIC 18 and the tab portion of the lead frame RM on which the switching element is mounted may be connected to GND or +Vcc power source voltage. As a result, the potential of the lead frame RM becomes stable and, therefore a configuration where noise hardly occurs in the MIC 18 can be achieved. Further, since malfunction of the MIC 18 due to switching noise of the MIC itself or influence of leaking electromagnetic field of the inductor 12 due to the switching can be greatly suppressed, a suitable switching control can be performed.

Further, the inductor 12 may be a wound-type inductor or a laminated-type inductor. In addition, various types of inductors such as an inductor press-molded by a dust core, an inductor of an open magnetic circuit structure made of a drum core and an inductor of a closed magnetic circuit structure whose periphery is covered with a cylindrical core may be applied.

In the above description, a case where the lead frame RM is configured by the split frames 16p to 16r has been described. However, a semiconductor device may be used in which the lead frame RM is configured by one continuous frame, the circuit element D is disposed on the front face of the lead frame, and the inductor 12 is disposed on the back face BF thereof. In this case, it is preferable in the viewpoint of short-circuit prevention, the lead frame RM and the back face BF of the substrate are insulated from each other and the inductor 12 is disposed on the back face of the substrate in which the lead frame RM is not provided.

Further, although the MIC 18, the substrate 20 and the chip capacitor 22 are employed as an example of the circuit element D in the present embodiment, a configuration other than these elements (for example, any element that generates a large amount of heat) may be included.

Further, upon forming the resin body 14, the heat sink 15 may be placed thereon and the portion on the contact surface side (resin body side) of the radiation substrate 15b may be sealed together by resin. In this way, the heat from a resin-sealed heat-generating source such as the inductor 12 is effectively transmitted to the radiation substrate 15b and therefore the heat can be radiated with high efficiency from the radiation fins 15f. Further, the heat sink 15 may be provided on the main face MF or on both of the main face MF and the back face BF.

Further, it is preferable that the thickness on the main face MF side of the resin body 14 is equal to or less than 1.7 times the thickness on the back face BF side of the resin body 14. As a result, it is easy to suppress the thermal stress generated in the resin body 14.

Although the illustrative embodiment of this disclosure has been described in the above, the illustrative embodiment is merely an example for embodying the technical spirit of this disclosure but does not specifically limit the material, shape, structure, arrangement and the like of the elements to those described above. This disclosure can be applied with various modifications without departing from the gist. Further, it should be noted that the drawings are schematic, and dimensional ratio or the like is different from the actual ratio. Accordingly, specific dimensional ratio or the like will be determined by reference to the above description. In addition, the portions having different dimensional relationship or ratio will be included among the drawings.

As described above, in the semiconductor device according to this disclosure, the IC element is disposed at a position corresponding to an axis of the inductor. As a result, the semiconductor device according to this disclosure can be properly used as a semiconductor device that suppresses strong radiation noise generated in the inductor even when the inductor is an octagonal columnar core or a circular columnar core, which is made of ferromagnetic material.

What is claimed is:

1. A semiconductor device comprising:
a lead frame comprising an outer lead portion;
an IC element comprising a switching element mounted on a main face of the lead frame;
an inductor mounted on a back face of the lead frame; and
a resin body configured to seal the lead frame, the IC element and the inductor, wherein the outer lead portion extends beyond the resin body,
wherein the inductor and the lead frame are closely contacted with each other,
wherein the IC element is disposed at a position corresponding to a center axis of the inductor,
wherein the inductor and the IC element are electrically connected to each other, and
wherein a wiring for a current path comprising at least one ground terminal and an input terminal, through which a main current of the switching element of the IC element flows, is disposed between a first terminal and a second terminal associated with the inductor.

2. The semiconductor device according to claim 1,
wherein the IC element is disposed on an inner side of an inductor coil included in the inductor, as seen from the center axis of the inductor.

3. The semiconductor device according to claim 1,
wherein the lead frame has electrical conductivity greater than the IC element.

4. The semiconductor device according to claim 1,
wherein a tab portion of the lead frame on which the switching element is mounted is connected to one of a ground and a power source voltage.

5. The semiconductor device according to claim 1,
wherein the inductor is configured by one of an octagonal columnar core or a circular columnar core, which is made of ferromagnetic material.

6. The semiconductor device according to claim 1,
wherein the inductor surface-contacts the back face so that there is no space between the inductor and the back face of the lead frame.

7. The semiconductor device according to claim 1,
wherein the semiconductor device is a Single In-line Package type semiconductor device.

8. The semiconductor device according to claim 1,
wherein a through hole for screw-fixing is formed at an opposite side of the semiconductor device from the outer lead, and
wherein a heat sink is screw-fixed to a side, which is the side of a back side, an external wall of the resin body.

9. The semiconductor device according to claim 1,
wherein the IC element is smaller than an inductor coil of the inductor, as seen from the center axis of the inductor.

* * * * *